United States Patent
Lee et al.

(10) Patent No.: US 6,995,056 B2
(45) Date of Patent: Feb. 7, 2006

(54) METHOD FOR FABRICATING SEMICONDUCTOR DEVICE CAPABLE OF PREVENTING DAMAGE BY WET CLEANING PROCESS

(75) Inventors: Sung-Kwon Lee, Ichon-shi (KR); Min-Suk Lee, Ichon-shi (KR)

(73) Assignee: Hynix Semiconductor, Inc., (KR)

( * ) Notice: Subject to any disclaimer, the term of this patent is extended or adjusted under 35 U.S.C. 154(b) by 24 days.

(21) Appl. No.: 10/880,953

(22) Filed: Jun. 29, 2004

(65) Prior Publication Data

US 2005/0074965 A1   Apr. 7, 2005

(30) Foreign Application Priority Data

Oct. 2, 2003   (KR) ...................... 10-2003-0068702

(51) Int. Cl.
*H01L 21/8249* (2006.01)
*H01L 21/3205* (2006.01)
*H01L 21/4763* (2006.01)

(52) U.S. Cl. ........................ 438/233; 438/586; 438/639
(58) Field of Classification Search ................ 438/233, 438/586, 595, 639
See application file for complete search history.

(56) References Cited

U.S. PATENT DOCUMENTS

| | | | |
|---|---|---|---|
| 5,356,834 A * | 10/1994 | Sugimoto et al. ........... 438/624 |
| 5,814,553 A * | 9/1998 | Chuang et al. ............. 438/595 |
| 5,897,372 A * | 4/1999 | Howard ...................... 438/637 |
| 6,057,581 A | 5/2000 | Doan | |
| 6,136,700 A * | 10/2000 | McAnally et al. .......... 438/666 |
| 6,165,880 A * | 12/2000 | Yaung et al. ................ 438/592 |
| 6,245,621 B1 | 6/2001 | Hirohama | |
| 6,436,841 B1 | 8/2002 | Tsai et al. | |
| 2003/0211717 A1 * | 11/2003 | Seo et al. .................... 438/586 |
| 2004/0110346 A1 * | 6/2004 | Tao ............................ 438/286 |
| 2004/0235259 A1 * | 11/2004 | Celii et al. .................. 438/396 |
| 2005/0181588 A1 * | 8/2005 | Kim ........................... 438/586 |

* cited by examiner

*Primary Examiner*—Matthew Smith
*Assistant Examiner*—Lex H. Malsawma
(74) *Attorney, Agent, or Firm*—Blakely Sokoloff Taylor & Zafman

(57) ABSTRACT

A method for fabricating a semiconductor device capable of preventing an inter-layer insulation layer from being damaged during a wet cleaning process. The method includes the steps of: forming a plurality of conductive structures on a substrate; forming an etch stop layer and a flowable insulation layer on the plurality of conductive structures subsequently; forming a photoresist pattern on the flowable insulation layer; forming a plurality of contact holes by etching the flowable insulation layer with use of the photoresist pattern as an etch mask, thereby exposing portions of the etch stop layer; forming at least one barrier layer on the contact holes; removing said at least one barrier layer and the etch stop layer disposed at each bottom portion of the contact holes to thereby expose the substrate; and cleaning the contact holes.

18 Claims, 7 Drawing Sheets

METHOD FOR FABRICATING SEMICONDUCTOR DEVICE CAPABLE OF PREVENTING DAMAGE BY WET CLEANING PROCESS

FIELD OF THE INVENTION

The present invention relates to a method for fabricating a semiconductor device; and, more particularly to, a method for fabricating a semiconductor device with use of a self-aligned contact process.

DESCRIPTION OF RELATED ARTS

A trend in a large-scale of integration has brought a need of forming semiconductor devices densely within a confined cell region. Thus, sizes of unit devices of a semiconductor device, for instance, transistors and capacitors, have been gradually decreased. Particularly, in a dynamic random access memory (DRAM) device, sizes of the unit devices formed within a cell region have been decreased as the design rule has been shifted towards minimization. For instance, DRAM devices are currently formed to have a minimum linewidth less than 0.1 μm and are often required to have a linewidth less than 80 nm. Hence, there exist many difficulties in applying conventional fabrication methods.

In case of applying a photolithography using a light source of ArF having a wavelength of 193 nm to a semiconductor device having a linewidth less than 80 nm, it is necessary to develop an additional recipe for preventing a photoresist deformation created during an etching process employed for the purposes of forming a pattern precisely and a vertical etch profile.

Meanwhile, advancement in an integration level of a semiconductor device has led device elements to be formed in stacks. A contact plug or a pad is one example of the stack structure.

For the contact plug, a landing plug contact (LPC) is commonly used since the LPC has a bottom portion which makes a wide contact within a minimum area and a top portion which is wider than the bottom portion for increasing a contact margin.

A self-aligned contact (SAC) etching process is required to form a LPC. The SAC etching process is a method of forming a contact by carrying out an etching process along a bottom structure having a specific etch selectivity ratio. Generally, the SAC etching process uses an etch selectivity ratio between nitride and oxide.

Recent trends in large-scale of integration and minimization of the design rule cause the distance between conductive patterns such as gate electrodes to decrease, but a thickness of a conductive pattern conversely increases. As a result, an aspect ratio representing a ratio of a height of a conductive pattern to a width of the conductive pattern has been gradually augmented.

Therefore, it is required to develop a method for filling empty spaces generated between the conductive patterns with a high aspect ratio. For instance, borophosphosilicate glass (BPSG) is employed for such purpose since BPSG has an excellent gap-filling property. However, since BPSG requires a high thermal flow process proceeding at a temperature greater than 800° C., there arises a problem that the BPSG is diffused into lateral sides.

One developing method for resolving the above problem is a flowfill process which employs a flowable insulation layer. Examples of the flowable insulation layer are an advanced planarization layer (APL) and a spin on glass (SOD) layer, which is also called a spin on dielectric (SOD) layer.

For the SOG layer, it is essential to densify the SOG layer through a curing process at a temperature ranging from 600° C. to 700° C. However, a bottom part of the SOG layer is not sufficiently densified, thereby being susceptible to a wet cleaning process performed after a contact formation process.

This problem will be described in detail with reference to the accompanying drawings.

FIGS. 1A and 1B are pictures of scanning electron microscopy (SEM) in a cross-sectional view for comparing a conventional BPSG layer with a conventional SOG layer each obtained after a SAC etching process.

Particularly, FIG. 1A is a cross-sectional view of the BPSG layer formed as a first inter-layer insulation layer ILD1, while FIG. 1B is a cross-sectional view of the SOG layer formed as a second inter-layer insulation layer ILD2. Also, FIGS. 1A and 1B respectively show contact holes C1 and C2 formed after the SAC etching process.

FIGS. 2A and 2B are pictures of SEM in a cross-sectional view for comparing a conventional BPSG layer with a conventional SOG layer after a wet cleaning process performed after a SAC etching process.

Particularly, FIG. 2A is a cross-sectional view showing the conventional BPSG layer taken along a line A–A' of FIG. 1A. As shown, there are not observed damages in the BPSG layer, which is a first inter-layer insulation layer ILD1, during the wet cleaning process using buffered oxide etchant (BOE) solution. Herein, the wet cleaning process is followed by the SAC etching process in order to secure a critical dimension (CD) of a bottom area of a contact and remove etch remnants.

FIG. 2B is a cross-sectional view showing the conventional SOG layer taken along a direction of a line B–B' of FIG. 1B. As shown, a bottom portion of a second inter-layer insulation layer ILD2, i.e., the SOG layer, which is partially cured, is easily damaged during the wet cleaning process since the bottom portion is not sufficiently densified. The reference denotation A expresses the damage created during the wet cleaning process. However, a top portion of the SOG layer is almost intact. A thickness T of the SOG layer that can be completely cured is 4,000 Å.

FIGS. 3A and 3B are pictures of SEM in a top view for comparing a conventional BPSG layer with a conventional SOG layer obtained after a plug formation process.

Particularly, FIG. 3A is a cross-sectional view showing the conventional BPSG layer used as a first inter-layer insulation layer ILD1. A conductive layer, e.g., a polysilicon layer, is deposited on a substrate structure including a contact hole formed by etching the inter-layer insulation layer ILD1 and is subsequently subjected to a chemical mechanical polishing (CMP) process. From this CMP process, a plurality of plugs P1 is formed. In case of employing the BPSG layer as the first inter-layer insulation layer ILD1, there are not problems of an electric short between the plugs P1 and degradation of an insulation property since the first inter-layer insulation layer ILD1 is not affected by a wet cleaning process.

FIG. 3B is a cross-sectional view showing the conventional SOG layer used as a second inter-layer insulation layer ILD2. As shown, a bottom portion of the second inter-layer insulation layer ILD2, i.e., the SOG layer, is damaged by a wet cleaning process, and this damaged portion of the bottom portion of the second inter-layer insulation layer ILD2 deteriorates an insulation property of the second inter-layer insulation layer ILD2 disposed between plugs P2. There may be a problem of an electric short between the plugs P2 if this damage becomes more severe.

Therefore, it is necessary to develop a method for preventing an inter-layer insulation layer, e.g., the SOG layer, from being damaged by a wet cleaning process since there is generated a difference in density caused by a limitation in curing the SOG layer up to a certain thickness.

SUMMARY OF THE INVENTION

It is, therefore, an object of the present invention to provide a method for fabricating a semiconductor device capable of preventing an inter-layer insulation layer from being damaged during a wet cleaning process due to a difference in density created by reliance on a thickness of the SOG layer subjected to a curing process.

In accordance with one aspect of the present invention, there is provided a method for fabricating a semiconductor device, including the steps of: forming a plurality of conductive structures on a substrate; forming an etch stop layer and a flowable insulation layer on the plurality of conductive structures subsequently; forming a photoresist pattern on the flowable insulation layer; forming a plurality of contact holes by etching the flowable insulation layer with use of the photoresist pattern as an etch mask, thereby exposing portions of the etch stop layer; forming at least one barrier layer on the contact holes; removing said at least one barrier layer and the etch stop layer disposed at each bottom portion of the contact holes to thereby expose the substrate; and cleaning the contact holes.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a method for fabricating a semiconductor device capable of preventing damage by a wet cleaning process in accordance with a preferred embodiment of the present invention will be described in detail with reference to the accompanying diagrams.

Figure 1A:
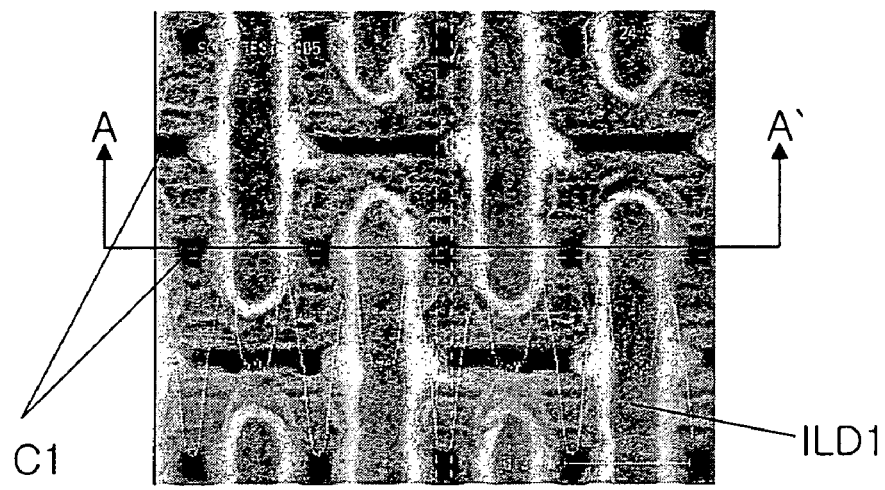
FIG. 1A is a picture of scanning electron microscopy (SEM) showing a cross-sectional view of a conventional borophosphosilicate glass (BPSG) layer obtained after a self-aligned contact (SAC) etching process.
Figure 1B:
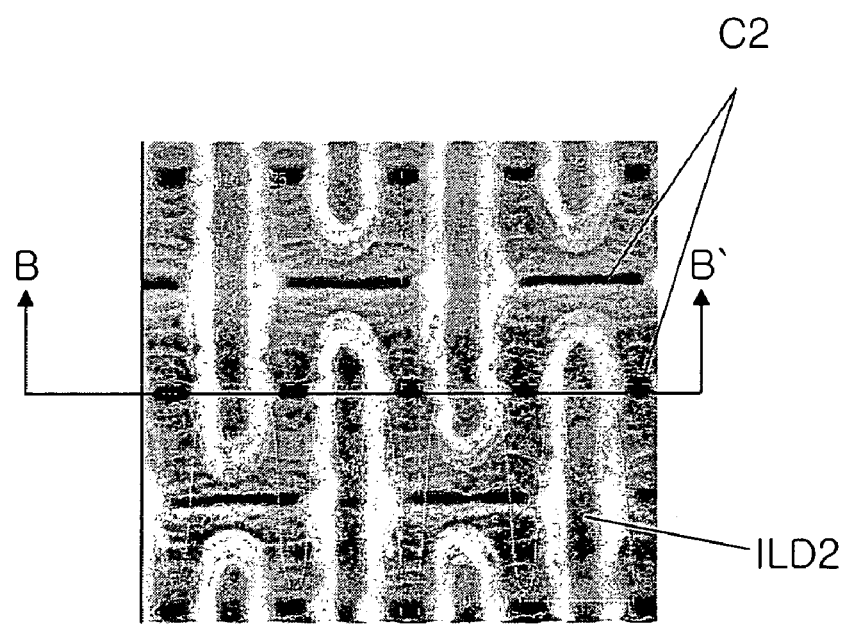
FIG. 1B is a picture of SEM showing a cross-sectional view of a conventional spin on glass (SOG) layer obtained after a SAC etching process.
Figure 2A:
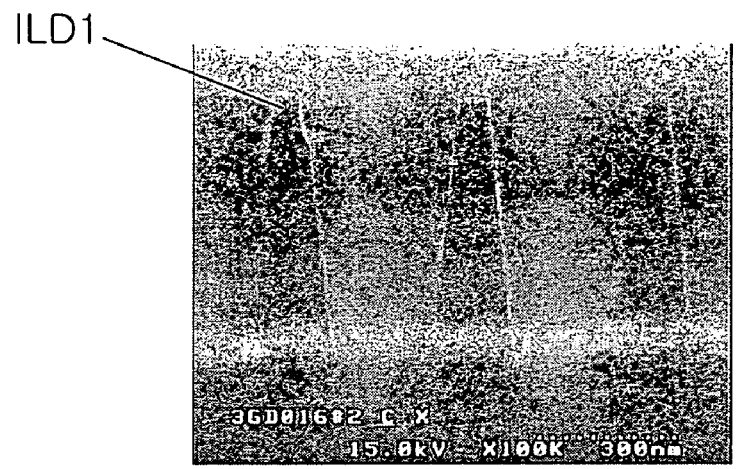
FIG. 2A is a picture of SEM showing a cross-sectional view of a conventional BPSG layer obtained after a SAC etching process and a wet cleaning process.
Figure 2B:
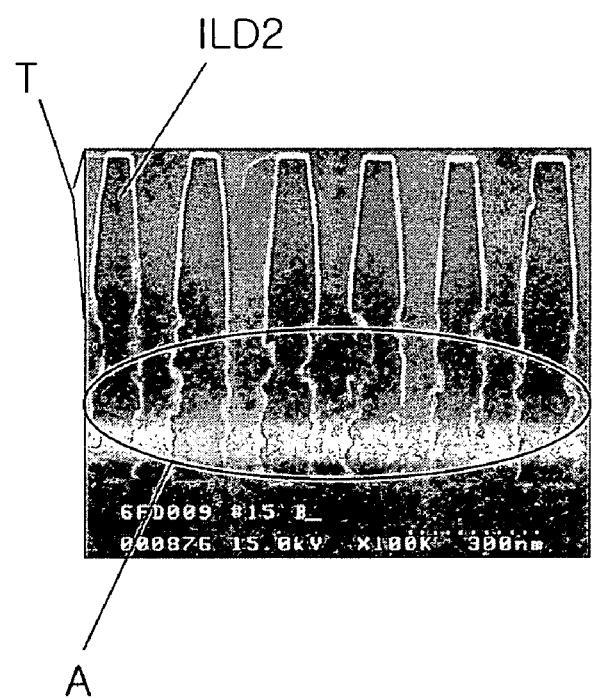
FIG. 2B is a picture of SEM showing a cross-sectional view of a conventional SOG layer obtained after a SAC etching process and a wet cleaning process.
Figure 3A:
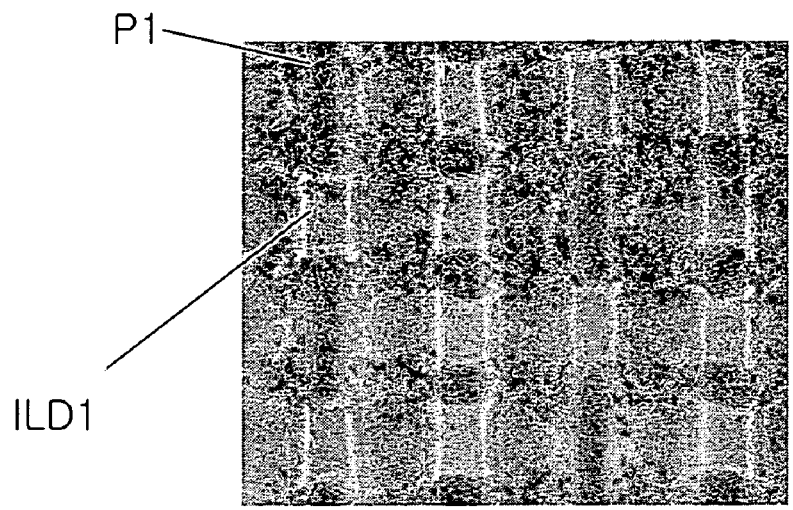
FIG. 3A is a picture of SEM showing a cross-sectional view of a conventional BPSG layer obtained after a plug formation process.
Figure 3B:
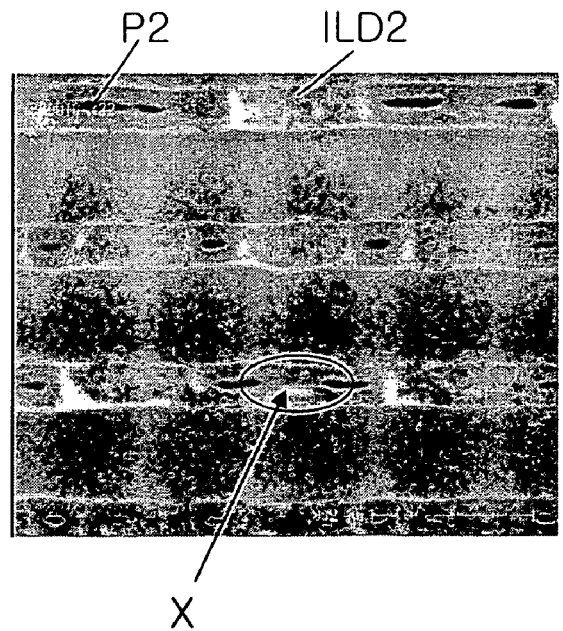
FIG. 3B is a picture of SEM showing a cross-sectional view of a conventional SOG layer obtained after a plug formation process.
Figure 4:
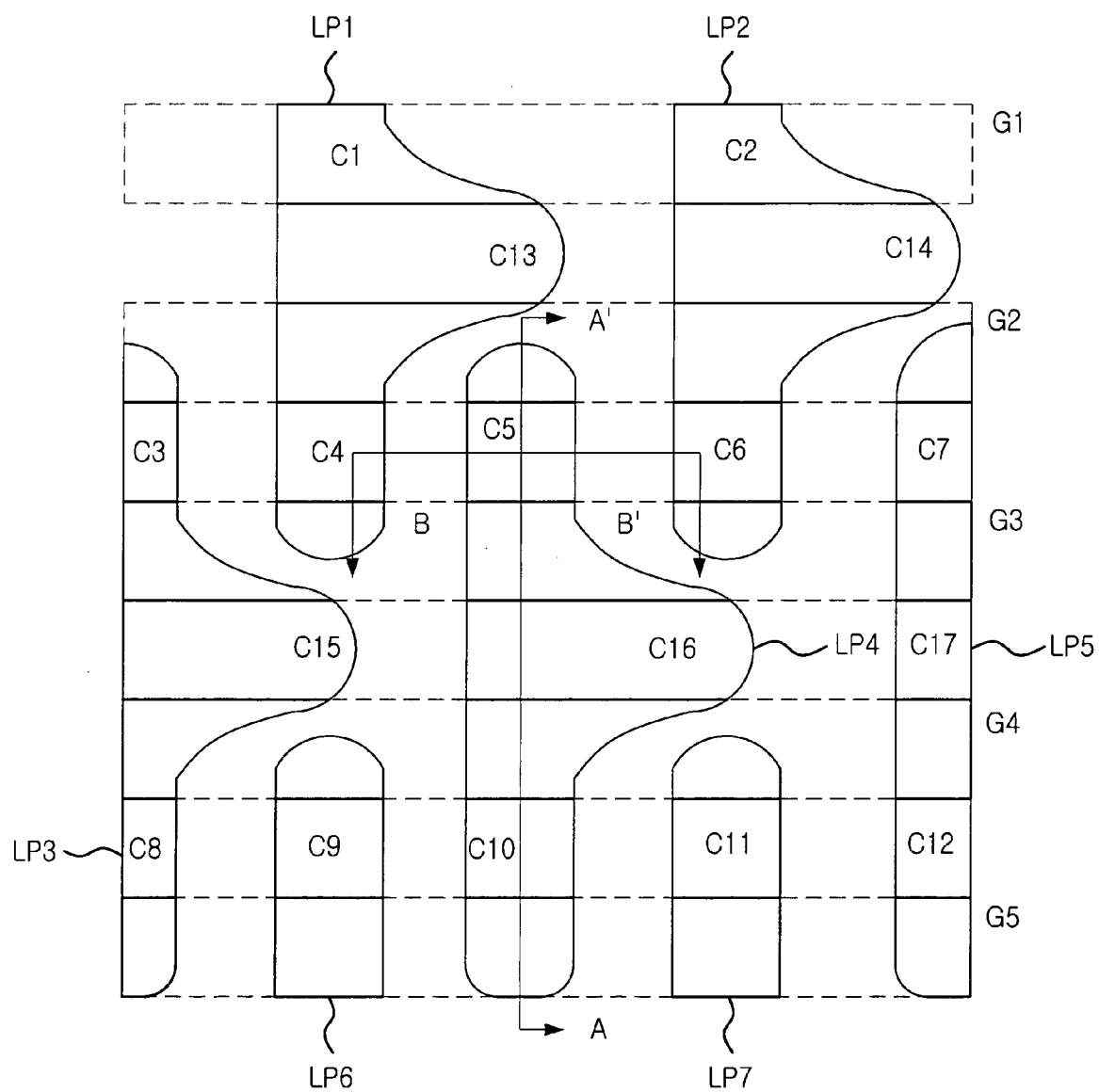
FIG. 4 is a diagram showing a layout of a semiconductor device obtained after a SAC etching process for forming a landing plug contact in accordance with a preferred embodiment of the present invention.

FIG. 4 is a diagram showing a layout of a semiconductor device obtained after a self-aligned contact (SAC) etching process.

As shown, a plurality of gate electrodes G1 to G5 are arranged a uniform distance apart. In a crossing direction to the gate structures G1 to G5, a plurality of T-type landing plugs LP1 to LP7 are formed by arranging a set of contact hole C1 to C17 in the form of T. Herein, the reference numerals from LP1 to LP7 represent a first to a seventh landing plugs, respectively. Each of the first to the seventh landing plugs LP1 to LP7 includes three contact holes. For instance, in the first landing plug LP1, contact holes for storage node contacts are denoted as C1 and C4, while a contact for a bit line contact is denoted as C13. That is, reference denotations C1 to C12 represent contact holes for storage node contacts, while reference denotations C13 to C17 represent contact holes for bit line contacts.

Meanwhile, although not illustrated, an inter-layer insulation layer is formed on the gate structures G1 to G5 disposed between each two of the first to the seventh landing plugs LP1 to LP7.

Hereinafter, detailed description on a method for forming a semiconductor device will be provided with reference to FIGS. 5A to 5E showing cross-sectional views of FIG. 4 taken along a direction of a line A–A' and a line B–B'.

FIGS. 5A to 5E are cross-sectional views illustrating a method for fabricating a semiconductor device in accordance with a preferred embodiment of the present invention. Although the preferred embodiment of the present invention exemplifies a contact hole for forming a landing plug contact, this contact hole can be employed in other methods for forming a metal wire contact, a bit line contact or a storage node contact of a capacitor contacting to an impurity junction region such as a source/drain junction and for forming a contact pad. Also, the same reference denotations are used for the gate structures G1 to G5.

Figure 5A:
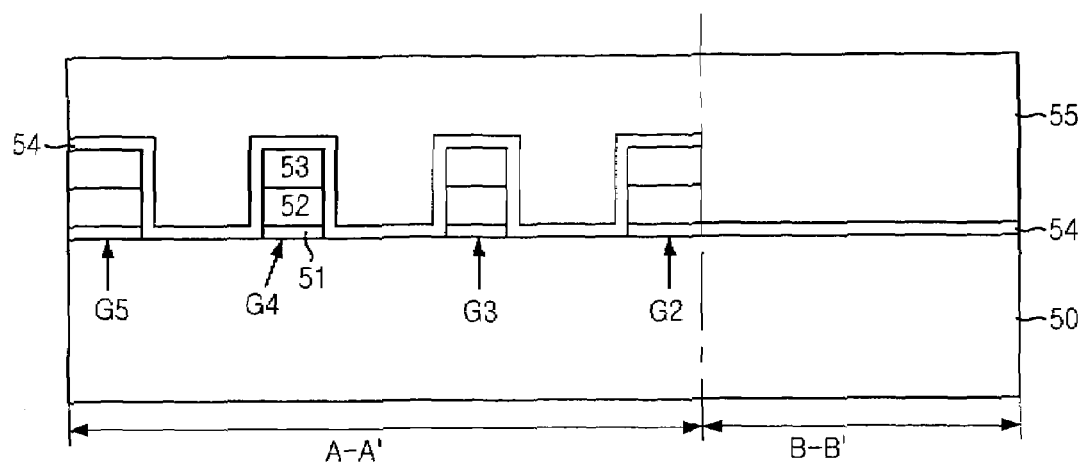
FIGS. 5A to 5E are cross-sectional views illustrating a method for forming a semiconductor device in accordance with a preferred embodiment of the present invention.

Referring to FIG. 5A, a plurality of gate structures G2 to G5 are formed by stacking a gate hard mask 53, a gate conductive layer 52 and a gate insulation layer 51 on a substrate 50 provided with various device elements.

The gate insulation layer 51 is made of an oxide-based material such as silicon dioxide. The gate conductive layer 52 is made of a material selected from a group consisting of polysilicon, tungsten (W), tungsten nitride ($WN_x$), tungsten silicide ($WSi_x$). Also, it is possible to form the gate conductive layer 52 by using a material combining these listed materials.

The gate hard mask 53 serves to prevent the gate conductive layer 52 from being damaged during a process for forming a contact hole by etching an inter-layer insulation layer, which will be subsequently formed. Thus, the gate hard mask 53 is made of a material having a specific etch selectivity with respect to the inter-layer insulation layer. For instance, if the inter-layer insulation layer is made of an oxide-based material, the gate hard mask 53 is made of a nitride-based material such as silicon nitride (SiN) or silicon oxynitride (SiON). If the inter-layer insulation layer is made of a polymer-based low dielectric material, the gate hard mask 53 is made of an oxide-based material.

Although not illustrated, there are impurity diffusion regions such as source/drain junctions formed in the substrate 50 disposed between each two of the gate structures G2 to G5.

More specific to the formation of the impurity diffusion regions, impurities are first implanted into the substrate 50 through an ion implantation process performed in alignment to the gate structures G2 to G5. A plurality of spacers are formed on sidewalls of the gate structure G2 to G5. Then, another ion implantation process is performed to form lightly doped drain (LDD) structures. Herein, more detailed descriptions on the respective ion-implantation processes for forming the LDD structures and the impurity diffusion regions and the spacer formation process are omitted.

Next, an etch stop layer 54 is formed on an entire surface of the above resulting structure. Herein, the etch stop layer 54 plays a role in preventing the substrate 50 from being damaged during a subsequent SAC etching process. At this time, it is preferable to form the etch stop layer 54 along a profile containing the gate structures G2 to G5. Also, the etch stop layer 54 is made of a nitride-based material such as silicon nitride or silicon oxynitride.

However, each of the gate structures G2 to G5 has a large aspect ratio, whereby the gap-fill property of a material to be formed between the gate structures G2 to G5 becomes degraded. Therefore, a flowable insulation layer 55 is employed for improving the gap-fill property of the material to be formed on the etch stop layer 54 between the gate structures G2 to G5. The flowable insulation layer 55 can be a spin on glass (SOG) layer or an advanced planarization layer (APL).

In case the SOG layer is employed as the flowable insulation layer 55, a silazane-based material having a molecular weight ranging from approximately 1,000 amu to approximately 10,000 amu is typically used for the SOD layer. The silazane has a structural formula of —(SiR1R2R3)$_n$— and classified into perhydropolysilazane in which functional groups of R1, R2 and R3 are all hydrogens and organic polysilazane in which functional group of R1, R2 and R3 are respective organic atom groups such an alkyl group having about 1 to 8 of carbons, an aryl group and an alcoxyl group.

Also, a certain percentage by weight of polysilazane is contained in an organic solvent such as dibuthyl ether, toluene or xylene to be used as a coating material. Generally, SOG which is commonly called polysilazane can be applicable to a high thermal treatment compared with siloxane-based materials such as silicate and silsesquioxane. Therefore, it is possible for the above mentioned SOG to be securely applied with a curing process and thus to improve a tolerance to a wet etching/cleaning process. Also, manufacturing processes can be applicable more easily to the SOG layer than a hydrogen silsesquioxane (HSQ) layer.

A thickness of the SOG layer can be controlled by changing a weight ratio of solid dissolved in a solution of polysilazane and a speed of a spinner used in the coating process. For instance, under control of rotation numbers of a spinner in several hundreds to several thousands rounds per minute, approximately 20% by weight of solid polysilazane in a solution of dibuthyl ether is coated until a thickness of approximately 5,000 Å of the SOG layer is obtained.

After the polysilazane is coated, the solvent is removed through a bake process. The bake process can be one of a prebake process carrier out at a temperature ranging from approximately 80° C. to approximately 350° C., a hard bake carried out at a temperature around 400° C., and a combination thereof. Also, the bake process makes xylene and other compositions such as nitrogen and hydrogen discharged in a gaseous state from the SOG layer.

A thermal treatment is performed at a temperature of approximately 700° C. for approximately 10 minutes to approximately 60 minutes to discharge other components, and then, a curing process for forming a silicon oxide layer is performed at a temperature ranging from approximately 600° C. to approximately 700° C. for approximately 10 minutes to one hour. Herein, the curing process proceeds in an oxidizing atmosphere by supplying vapor to thereby make organic compositions of the coated polysilazane and other compositions except for the silicon discharged and subsequently form the silicon oxide layer through supply of oxygen. This curing process is repeated at least more than one to two times. At this time, examples of an ambient gas are water ($H_2O$), oxygen ($O_2$), nitrogen ($N_2$), hydrogen ($H_2$) and dinitrogen oxide ($N_2O$) which can be used singly or in combination.

If the APL layer is used as the flowable insulation layer 55, the APL layer is formed in three different steps. At this time, silane ($SiH_4$) and hydrogen peroxide ($H_2O_2$) are used as source gases.

In a first step of forming the APL layer, a bottom part of a substrate structure is treated with a plasma in order to promote adhesiveness and flow characteristics of the APL layer. At this time, this plasma treatment proceeds at a plasma enhanced chemical vapor deposition (PECVD) chamber with supply of $N_2O$ gas or $N_2$ gas. Also, the PECVD chamber is maintained with a pressure of approximately 400 mTorr and a power of approximately 500 W.

In a second step, the APL layer is deposited on the substrate structure based on gap-filling and self-planarization characteristics of the APL layer. This deposition process proceeds at a low pressure (LP)-CVD chamber by using source gases of $SiH_4$ and $H_2O_2$. These source gases react with each other to form the APL layer in which a group of hydrogen is attached to silicon oxide. This reaction is shown as follows.

$$SiH_4 + H_2O_2 \rightarrow Si(OH)_4 \rightarrow SiO_xH_y \qquad \text{Equation 1}$$

In a third step, a furnace annealing process is performed in an atmosphere of $SiH_4$, $N_2O$ and/or $N_2$ to remove the group of hydrogen from the silicon oxide, thereby completing the APL layer formation.

Figure 5B:
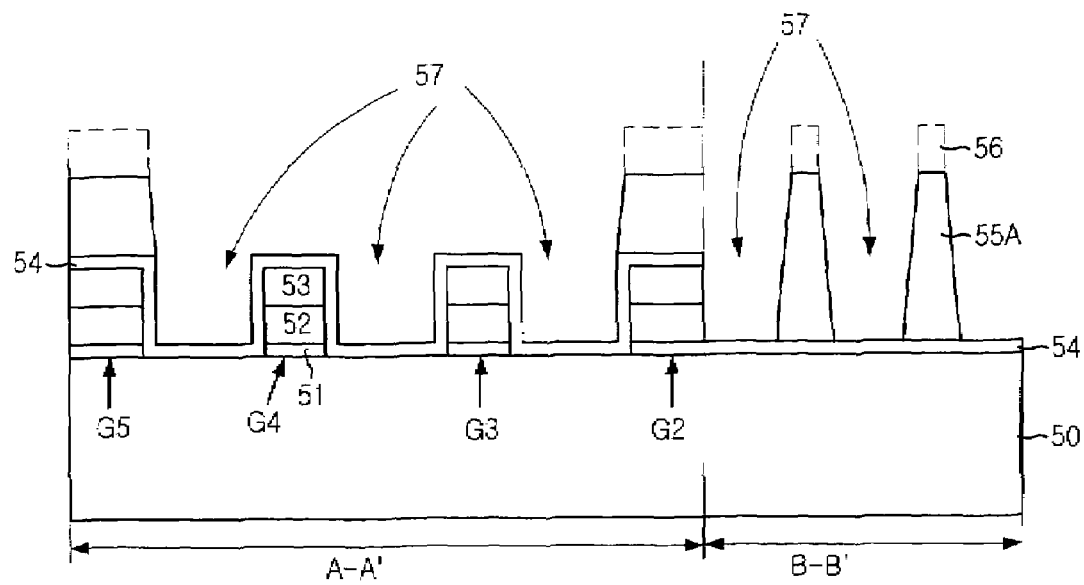

Referring to FIG. 5B, a photoresist is coated on the above resulting structure by performing a spin coating method. Predetermined portions of the photoresist are selectively photo-exposed by employing a lithography device such as KrF, ArF or $F_2$ device and a predecided reticle (not shown) for defining a width of a contact hole. Thereafter, a developing process proceeds by making a photo-exposed portion or a non-photo-exposed portion remain, and a cleaning process is then performed to remove etch remnants. After the photo-exposure and the developing processes, a photoresist pattern 56 for forming a landing plug contact (LPC) is formed.

Prior to forming the photoresist pattern 56, it is possible to form an anti-reflective coating (ARC) layer over the flowable insulation layer. The ARC layer serves to prevent formation of an undesired pattern caused by scattering reflections occurring due to a high index of reflection of the flowable insulation layer and to improve adhesiveness of the photoresist pattern 56 with the flowable insulation layer. The ARC layer is made of an organic-based material having a similar etch characteristic with the photoresist pattern 56.

A hard mask can be also formed between the flowable insulation layer and the photoresist pattern 56 or between the flowable insulation layer and the ARC layer. At this time, the hard mask can be made of a material such as a nitride-based insulating material or a conducting material such as tungsten and polysilicon.

Next, the flowable insulation layer is etched by performing a SAC etching process with use of the photoresist pattern 56 as an etch mask, thereby obtaining a patterned flowable insulation layer 55A. From this SAC etching process, a plurality of contact holes 57 exposing predetermined portions disposed between each two of the gate structures G2 to G5 are formed. At this time, the patterned flowable insulation layer 55A is obtained by employing a typical recipe for the SAC etching process. That is, such a gas as $CF_4$, $C_4F_6$, $C_4F_8$, $CH_2F_2$ or $C_5F_8$ is mainly used along with an additional carrier gas such as He, Ne or Ar. After the SAC etching process, the photoresist pattern 56 is removed.

Figure 5C:
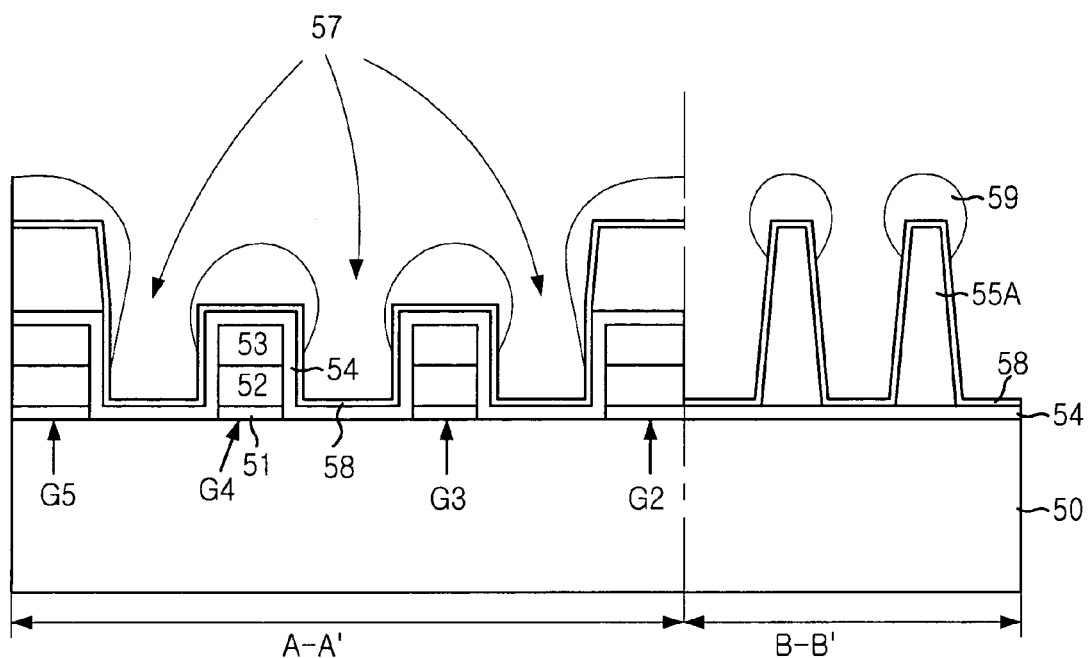

Referring to FIG. 5C, a first barrier layer 58 made of a nitride-based material and a second barrier layer 59 made of an oxide-based material are formed on the above resulting structure by employing a plasma enhanced chemical vapor deposition (PECVD) having a poor step coverage property. At this time, the first barrier layer 58 and the second barrier layer 59 are deposited with a thinner thickness at bottom portions of the contact holes 57 than at top portions of the gate structures G2 to G5. Herein, the first barrier layer 58 is formed to have a thickness ranging from approximately 20 Å to approximately 150 Å.

Figure 5D:
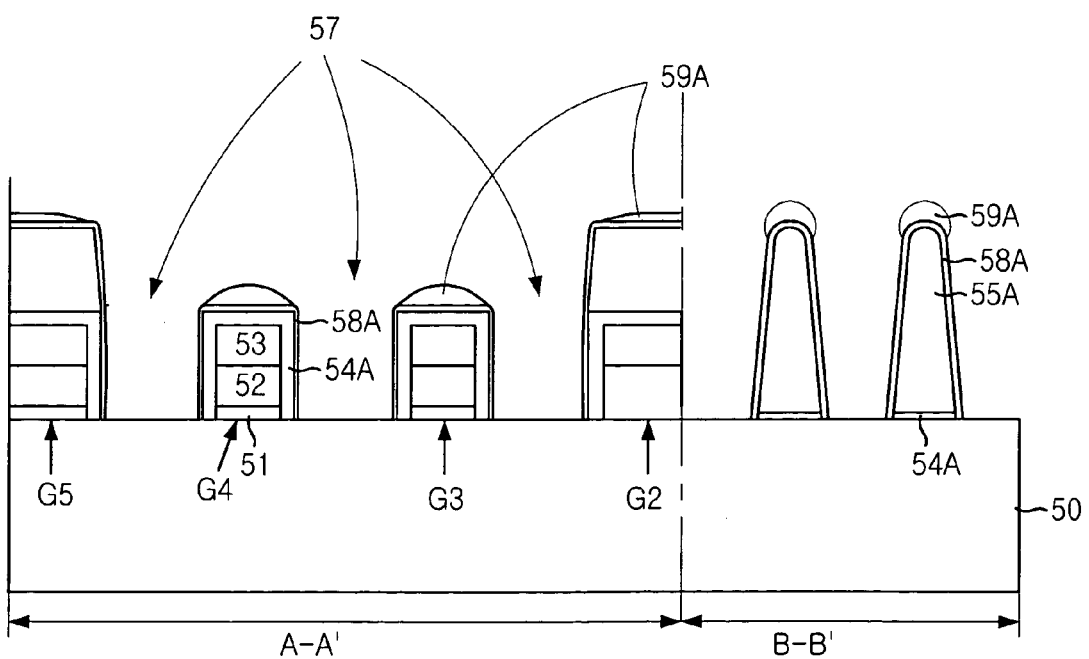

Referring to FIG. 5D, the etch stop layer 54, the first barrier layer 58 and the second barrier layer 59 shown in FIG. 5C are subjected to a blanket etch process which continues until the impurity diffusion regions of the substrate 50 are exposed between each two of the gate structures G2 to G5. During the blanket etch process, portions of the etch stop layer 54 and the first barrier layer 58 disposed at each bottom portion of the contact holes 57 are removed, thereby obtaining a remaining etch stop layer 54A and a remaining first barrier layer 58A.

Especially, portions of the remaining etch stop layer 54A and the remaining first barrier layer 58A disposed at each sidewall of the gate structures G2 to G5 become spacers for the gate structures G2 to G5. Also, the second barrier layer remaining after the blanket etch process is denoted with a reference number 59A.

Subsequent to the blanket etch process, a wet cleaning process is performed by using a cleaning solution such as buffered oxide etchant (BOE) and fluoric acid (HF) in order to remove etch remnants remaining after the SAC etching process and the blanket etch process and to secure a critical dimension (CD) of each bottom portion of the contact holes 57. At this time, it is preferable to use a solution of HF diluted with water in a ratio of approximately 50 to 500 parts of water to approximately 1 part of HF.

However, since the remaining first barrier layer 58A and the remaining second barrier layer 59A cover the sidewalls and a top portion of the patterned flowable insulation layer 55A, the patterned flowable insulation layer 55A is not damaged during the above wet cleaning process.

Figure 5E:
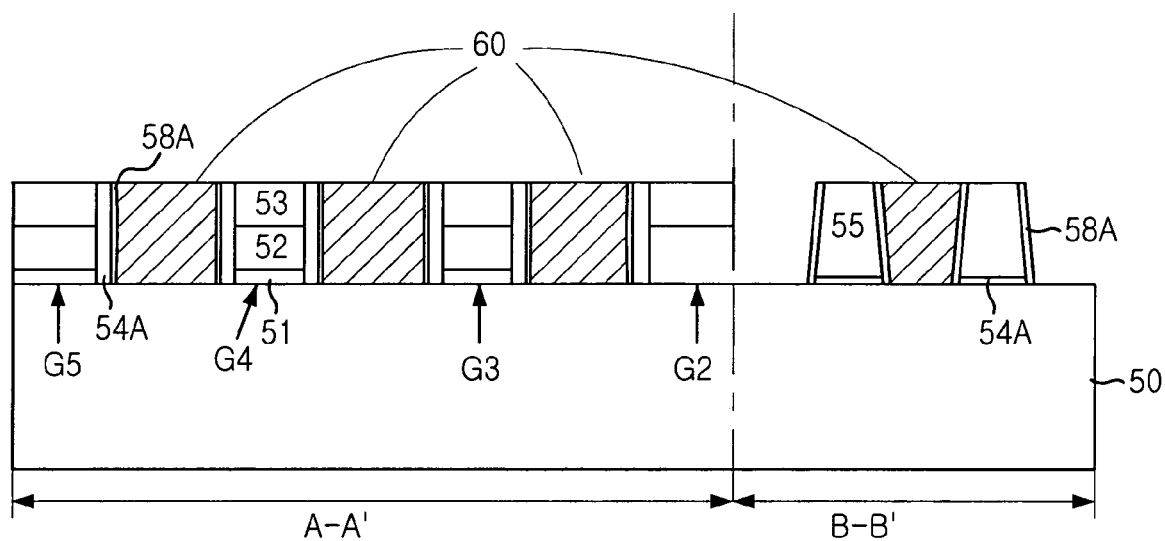

Referring to FIG. 5E, a conducting material for forming a plurality of plugs is completely filled into the contact holes 57, and then, a chemical mechanical polishing (CMP) process is performed until each gate hard mask 53 is exposed. After the CMP process, a plurality of plugs 60 are formed so as to be electrically connected to the respective impurity diffusion region.

Prior to performing the CMP process, the conducting material for forming the plugs 60 is subjected to an etch-back process for alleviating a difference in height between device elements in a cell region and a peripheral circuit region, whereby the CMP process can be easily applied.

The conducting material is typically polysilicon, and such a barrier metal layer as titanium (Ti) and titanium nitride (TiN) can be possibly stacked thereon. It is also possible to employ tungsten (W) as the conducting material. Recently, a selective epitaxial growth (SEG) method is frequently used to form the plugs 60.

In accordance with the preferred embodiment of the present invention, the SAC etching process is performed to the flowable inter-layer insulation layer made of the SOG layer or the APL layer is formed, and then, the etch stop layer is removed after the first and the second barrier layers are formed by employing a deposition method providing a poor step coverage property such as PECVD. Afterwards, the wet cleaning process proceeds to thereby complete the contact opening process.

Based on the preferred embodiment of the present invention, it is possible to prevent the flowable inter-layer insulation layer from being damaged during the wet cleaning process by covering the sidewalls and the top portion of the flowable inter-layer insulation layer with the first and the second barrier layers. As a result, it is possible to minimize defect generations which further improve yields of semiconductor devices.

Although the preferred embodiment of the present invention exemplifies the SAC etching process with use of the T-type photoresist pattern, it is still possible to use line type or hole type photoresist patterns for the SAC etching process. Also, in addition to the contact opening process between the gate structures, the SAC etching process can be applied to a bit line opening process, i.e., a storage node contact hole formation process, and a via contact formation process.

The present application contains subject matter related to the Korean patent application No. KR 2003-0068702, filed in the Korean Patent Office on Oct. 2, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
    forming a plurality of conductive structures on a substrate;
    forming an etch stop layer and a flowable insulation layer on the plurality of conductive structures;
    forming a photoresist pattern on the flowable insulation layer;
    forming a plurality of contact holes by etching the flowable insulation layer with use of the photoresist pattern as an etch mask, thereby exposing portions of the etch stop layer;
    forming at least one barrier layer on the contact holes;
    removing said at least one barrier layer and the etch stop layer disposed at each bottom portion of the contact holes to thereby expose the substrate; and
    cleaning the contact holes.

2. The method of claim 1, wherein the step of forming at least one barrier layer includes the steps of:

forming a first barrier layer made of a nitride-based material on the contact holes; and forming a second barrier layer made of an oxide-based material on the first barrier layer.

3. The method of claim 2, wherein the first barrier layer and the second barrier layer are formed by employing a plasma enhanced chemical vapor deposition (PECVD) method.

4. The method of claim 2, wherein the first barrier layer has a thickness ranging from approximately 20 Å to approximately 150 Å.

5. The method of claim 1, after the step of cleaning the contact holes, further including the step of forming a plurality of plugs each electrically connected to the exposed substrate.

6. The method of claim 5, wherein the step of forming the plurality of plugs includes the steps of:

forming a conductive material to be electrically connected with the exposed substrate;

removing a portion of the conductive material by performing an etch-back process; and forming the plurality of plugs.

7. The method of claim 6, wherein the step of forming the conductive material proceeds by employing a deposition method which deposits the conductive material into the plurality of contact holes.

8. The method of claim 6, wherein the step of forming the conductive material proceeds by employing a selective epitaxial growth method which grows the plug material from the exposed substrate.

9. The method of claim 1, wherein the photoresist pattern is a selected one of a T-type, a line type and a hole type.

10. The method of claim 1, wherein the conductive structure is a pattern for forming a gate structure.

11. The method of claim 1, wherein the conductive structure is a pattern for forming a bit line structure.

12. The method of claim 1, wherein the conductive structure is a pattern for forming a metal wire.

13. The method of claim 1, wherein the step of forming the plurality of contact holes proceeds by employing a self aligned etching process.

14. The method of claim 1, wherein the step of removing the etch stop layer proceeds by performing a blanket etch process.

15. The method of claim 1, wherein the flowable insulation layer is a spin on glass (SOG) layer.

16. The method of claim 1, wherein the flowable insulation layer is an advanced planarization layer (APL).

17. The method of claim 15, wherein, if the flowable insulation layer is the SOG layer, the step of forming the flowable insulation layer includes the steps of:

forming the SOG layer; and curing the SOG layer.

18. The method of claim 17, wherein the curing proceeds at a temperature ranging from approximately 600° C. to approximately 700° C. for approximately 10 minutes to approximately 60 minutes in an atmosphere of a gas selected from a group consisting of water ($H_2O$), oxygen ($O_2$), nitrogen ($N_2$), hydrogen ($H_2$) and dinitrogen oxide ($N_2O$).

* * * * *